(12) United States Patent
Medelius et al.

(10) Patent No.: US 6,420,862 B2
(45) Date of Patent: Jul. 16, 2002

(54) SYSTEM AND METHOD OF LOCATING LIGHTNING STRIKES

(75) Inventors: Pedro J. Medelius, Merritt Island; Stanley O. Starr, Indialantic, both of FL (US)

(73) Assignee: The United States of America as represented by the Administrator of the National Aeronautics and Space Administration, Washington, DC (US)

( * ) Notice: Subject to any disclaimer, the term of this patent is extended or adjusted under 35 U.S.C. 154(b) by 0 days.

(21) Appl. No.: 09/784,405

(22) Filed: Feb. 13, 2001

Related U.S. Application Data

(60) Provisional application No. 60/182,404, filed on Feb. 14, 2000.

(51) Int. Cl.$^7$ .............................................. G01R 31/02
(52) U.S. Cl. ...................................................... 324/72
(58) Field of Search ........................... 324/72; 340/600, 340/601, 602; 342/450, 453, 460; 73/170.24; 702/4; 706/931; 367/127, 128, 129

(56) References Cited

U.S. PATENT DOCUMENTS

| | | |
|---|---|---|
| 3,772,594 A | 11/1973 | Kuehnast |
| 4,138,660 A | 2/1979 | Hill |
| 4,792,806 A | 12/1988 | Bent et al. |
| 4,801,942 A | 1/1989 | Markson et al. |
| 4,803,421 A | 2/1989 | Ostrander |
| 4,806,851 A | 2/1989 | Krider et al. |
| 4,823,228 A | 4/1989 | Bittner |
| 4,873,483 A | 10/1989 | Ostrander |
| 4,972,195 A | 11/1990 | Markson et al. |
| 5,140,523 A | 8/1992 | Frankel et al. |
| 5,235,341 A | 8/1993 | Effland et al. |
| 5,263,368 A | 11/1993 | Breitmeier et al. |
| 5,295,071 A | 3/1994 | Kuzma et al. |
| 5,331,330 A | 7/1994 | Susnjara |
| 5,771,020 A | 6/1998 | Markson et al. |
| 5,977,762 A | 11/1999 | Murtha, Jr. et al. |

OTHER PUBLICATIONS

NASA Technical Opportunity Sheet (Website Jan. 4, 1999).
P. J. Medelius & H. J. Simpson "Accurate Lightning Location System," pp. 112–113 from Research and Technology 1997 Annual Report, John F. Kennedy Space Center.

*Primary Examiner*—N. Le
*Assistant Examiner*—Etienne P. LeRoux
(74) *Attorney, Agent, or Firm*—Gary G. Borda; John G. Mannix

(57) ABSTRACT

A system and method of determining locations of lightning strikes has been described. The system includes multiple receivers located around an area of interest, such as a space center or airport. Each receiver monitors both sound and electric fields. The detection of an electric field pulse and a sound wave are used to calculate an area around each receiver in which the lighting is detected. A processor is coupled to the receivers to accurately determine the location of the lighting strike. The processor can manipulate the receiver data to compensate for environmental variables such as wind, temperature, and humidity. Further, each receiver processor can discriminate between distant and local lightning strikes.

20 Claims, 1 Drawing Sheet

SYSTEM AND METHOD OF LOCATING LIGHTNING STRIKES

This patent application is related to U.S. Provisional Patent Application Ser. No. 60/182,404, entitled "Method and Apparatus for Accurate Location of Lightning Strikes", filed on Feb. 14, 2000.

ORIGIN OF THE INVENTION

The invention described herein was made in the performance of work under a NASA contract and is subject to the provisions of Section 305 of the National Aeronautics and Space Act of 1958, as amended, Public Law 85-568 (72 Stat. 435; 42 U.S.C. §2457).

BACKGROUND OF THE INVENTION

The present invention relates generally to identifying locations of lightning strikes.

Electronic equipment is susceptible to damage caused by nearby lightning strikes. The accurate knowledge of a lightning striking point is important to determine which equipment or system needs to be tested following a lightning strike. Existing lightning location systems can provide coverage of a wide area. For example, a lightning location system can provide coverage of an area having a 30 km radius. This system, however, has a 50% confidence region of about 500 meters. That is, the system has a 50% confidence that a lighting strike is within 500 meters of an identified location. As such, present lightning location systems cannot be used to determine whether a lightning strike occurred inside or outside of a parameter of an area of concern. One such application of a lightning location system is a space shuttle launch pad for the National Aeronautics and Space Administration (NASA). By accurately determining lightning strike locations, electronic equipment located within the launch pad area can be tested and/or reset to avoid erroneous operation.

One method of determining the location of lightning strikes uses a set of video cameras that are pointed in different directions within the area of concern. If a lightning strike occurs within the field of view of three or more cameras, the location of the strike can be determined. However, if the cameras are not pointed in the correct direction, or either an object or a heavy rain downpour obscures their field of view, it is difficult or impossible to accurately determine a striking point of the lightning. Further, this method has a relatively large uncertainty and does not facilitate an accurate location of the exact point of contact to the ground.

For the reasons stated above, and for other reasons stated below which will become apparent to those skilled in the art upon reading and understanding the present specification, there is a need in the art for the system and method to accurately locate locations of lightning strikes.

SUMMARY OF THE INVENTION

The above-mentioned problems with lightning strike location and other problems are addressed by the present invention and will be understood by reading and studying the following specification.

In one embodiment, a system to determine a location of lighting strikes comprises a processor, and a plurality of receivers coupled to the processor. Each of the receivers comprises an electric field sensor, an acoustic sensor, and a processor to provide a receiver output indicating a calculated time differential between an electric field pulse and a sound wave (thunder). The processor determines the location of lighting strikes in response to the output from the plurality of receivers.

A method is provided for determining a location of lightning strikes. The method comprises locating a network of at least three electric field sensors and at least three sonic sensors in an area of interest, and collecting lightning strike information, including a difference of the time of arrival of an electric field pulse and an associated sound wave from a lightning strike. The method processes lightning strike information recorded by the at least three electric field sensors and at least three sonic sensors, including measuring a time difference between the arrival of the electric field pulse and the sound wave at each electric field and sonic sensor. The processor uses the time differentials to produce estimates of the range between the receiver and the lightning strike. The processed information is used to determine the location of the lightning strike.

DETAILED DESCRIPTION OF THE INVENTION

In the following detailed description of the preferred embodiments, reference is made to the accompanying drawings that form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

The present invention provides a system and method that can accurately locate a lightning strike within an area of interest. In one embodiment, the present invention can accurately locate a lightning strike within a few meters. Further, receivers used to detect lightning strikes can be located at distances of approximately one kilometer and greater apart. As explained below, the present invention uses a combination of electric field and sonic sensors.

The fast varying electric current associated with lightning discharges generates large electric field variations. The electric field waveform propagates at the speed of light in a radial direction from the striking point of lightning. The sudden heating of the air caused by the large currents associated with the lightning discharge produces a sudden expansion of the air near the lightning channel. This results in a sound wave (thunder) that initially, for the first few meters, propagates at a supersonic speed and later propagates at a sonic speed.

For an observer located remotely from a lightning strike location, the electric field waveform arrives earlier than the sonic sounds. This is because the electric field waveform travels and a speed of approximately 300,000,000 m/s, while the sound wave travels and approximately 350 m/s. The observer can estimate the distance to striking point by measuring the time difference between the arrival of the electric field waveform and the arrival of the sound wave. This measurement defines a circle, with the observer at the center, on which the lightning strike might have occurred. The second observer and a different location using the same type of measurement also has a circle defined around them in which the lightning might have occurred. These two circles intersect at two points. With the addition of a third observer, a single striking point can be determined. The present invention provides receivers that can be located remotely from each other to accurately determine lightning strike locations.

Figure 1:
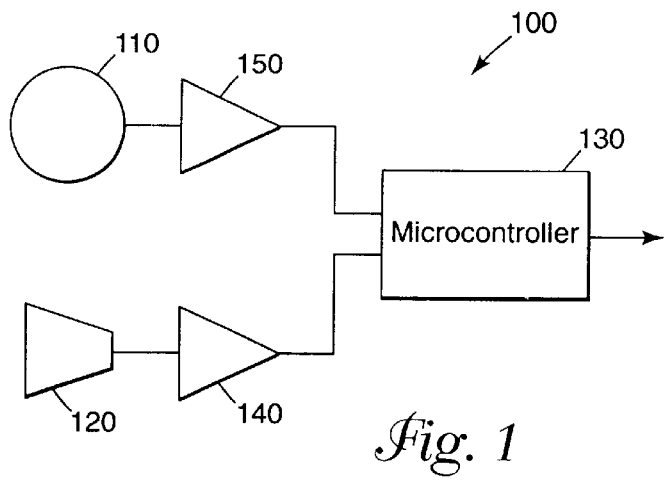
FIG. 1 is a block diagram of one embodiment of a receiver of the present invention.

Referring to FIG. 1, a block diagram of one embodiment of a receiver 100 of the present invention is illustrated. The receiver includes an electric field antenna 110, a microphone 120 and a microcontroller 130 coupled to receive amplified signals from the antenna and microphone. In operation, multiple receivers are located around an area of interest. Each receiver is used to detect changes in an electric field and detection of sonic sounds. The combination of the electric field and sonic level are used to determine a location of the lightning strike. In operation, the electric field antenna 110 detects changes in the electric field surrounding the antenna. The microphone 120 is used to detect sonic sounds surrounding the antenna. The output of each of these components can be amplified by amplifiers 140 and 150, if necessary, and the microcontroller 130 performs an analysis of the outputs to determine a radius around the receiver in which a lightning strike may have occurred. An example of this analysis is described in more detail below. By using three remotely located receivers, an accurate location of lightning strikes can be determined.

Figure 2:
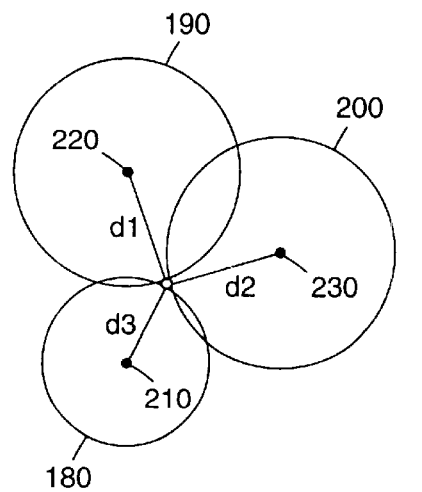
FIG. 2 illustrates circles defined by a time difference between the arrival of an electric field signal and a sonic signal.

Referring to FIG. 2, the location of a lightning strike can be determined by the intersection of three circles 180, 190 and 200 defined by the time difference between the arrival of an electric field signal and a sonic signal. Each of the three circles are located around three remotely spaced receivers, 210, 220 and 230, respectively. As explained above, each of the receivers determines a radius within which the lightning strike may have occurred. This radius, or distance $d_n$, can be defined as the speed of sound (c) times the time difference ($t_n$) between electric field signal in the sonic signal ($d_n = c*t_n$).

The present system relies on the accurate determination of the time elapsed between the reception of the electric field waveform and the reception of the sound waveform. The electric field waveform has a rise time in the order of a few microseconds, and its start can be determined with an accuracy of a fraction of a microsecond. At close distances, the sound waveform has a sharp wavefront. That is, its high frequency content (frequency>10 kHz) is a large. The sound waves propagating through air suffer large attenuation at high frequencies as compared to the attenuation of the low frequencies. The attenuation of the high frequencies is further enhanced by heavy rain. Thus, at close distances, the start of the sound wavefront can be easily measured since it has a fast rise time. At distances of greater than one or two kilometers, the wavefront rises slower, making it difficult to detect the exact time of the sound wave.

Figure 3:
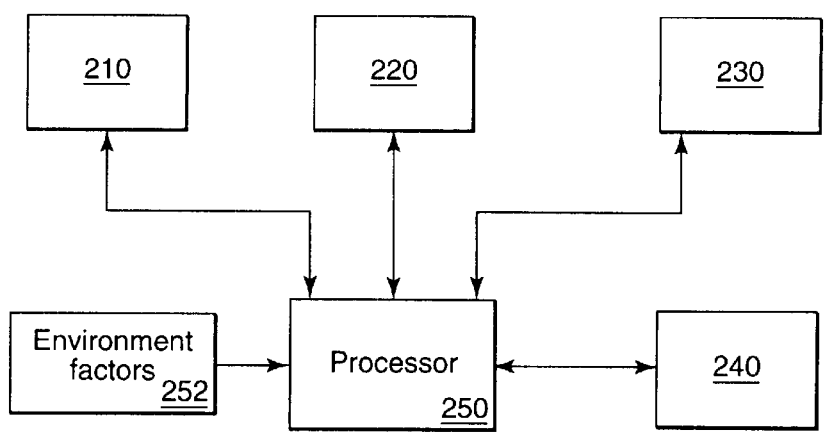
FIG. 3 is a block diagram of a system of the present invention.

In one embodiment of the present invention, the system includes a network of at least three receivers at different locations within a perimeter of interest to be monitored for lightning strikes. The microcontroller of each receiving station is used to measure the time difference between the arrival of the electric field pulse and the arrival of the sound wave. The timing information from each receiver 210, 220 and 230 is transmitted back to a central processing location 250, where the timing information is processed to obtain the location of the lightning strike, see FIG. 3. The accuracy of the system can be enhanced in one embodiment by using more than three receivers, such as receiver 240. A network of four or more receivers, for example, can be used to resolve uncertainties introduced by wind speed. Echoes and reflections from objects within the monitored area can be removed using common digital signal processing techniques.

The present invention allows for the accurate location of a lightning strike within a few meters using a combination of electric field and sonic sensors. One advantage of the present system includes the fact that high-speed digitizers are not required. The electric field pulse is used to start a time counter, and the sound wave is used to stop the time counter. A one-millisecond error in determination of the timing can result in an error of about 30 cm. Existing wideband, large baseline lightning location systems require timing accuracies better than a fraction of a nanosecond to achieve this kind of accuracy. The present invention provides an inexpensive and easy to install system, with minimal maintenance and calibration requirements.

The present invention allows for the determination of the distance to a lightning strike without requiring fast recording or digitizing equipment. Further, an algorithm to combine the information from a network of receivers allows for fine-tuning the system. Also, for example, an algorithm can be implemented to determine the location of a lightning strike when the wind is nonzero. This is important since nonzero wind will result in noncircular distance patterns around each receiver.

In another embodiment, the present system discriminates between nearby and distant thunder. Because sound waves are attenuated as they propagate through air, with high frequencies decaying faster than low frequencies, the frequency spectrum of nearby thunder contains higher frequency components than thunder from a distant lightning strike. The characteristic "rumble" from thunder consists mainly of frequencies below 100 Hz, while the "clap" occurred following a close lightning strike contains components above several kHz.

The following receiver algorithm illustrates discrimination between local and distant lightning strikes to avoid erroneous detection outside an area of interest:

| | |
|---|---|
| x =rf("data") | Read data file. |
| h =rf("hpf") | Read highpass filter, cutoff of 200 Hz, finite impulse response (FIR), 31st order. |
| y =x$h | Perform time-domain convolution between data file and filter impulse response. This is equivalent to multiplying the spectrum of the thunder data by the frequency response of the filter. The result of the convolution is stored in variable y. |
| y =y-avg(y) | Center variable y around zero (remove DC component). |
| z =abs(y) | Get the absolute value of y and storage in variable z. This is equivalent to performing a rectification of the filtered thunder signal. |
| I =rf("Ipf") | Read low pass filter, cut off of 10 Hz, finite impulse response (FIR), 31st order. |
| z =z$l | Perform a time-domain convolution between the rectified thunder signal and the low pass filter impulse response. This results in the envelope of the thunder signal. |

-continued

| | |
|---|---|
| pop =FALSE | Determine the start of the thunder waveform by eliminating the |
| for(i=0:len:1) | "pop" sound caused by nearby lightning. This is done by |
| for(j:=0:500) | eliminating pulses with a duration shorter than 50 ms. |
| if(z[i+j]<thr) | |
| then pop=TRUE | |
| end | |
| end | |
| if(pop=FALSE) | |
| thunderstart=i | The start of the thunder waveform is the amplitude "i" of the |
| end | data set. This is the value that is used to determine the |
| end | spatial location of the lightning strike. |

The primary sources of location error in the described invention are due to variations in the speed of sound and due to the effect of wind. The sound speed in air is a function of the temperature (changing as the square root of the absolute temperature) and the molecular weight. The latter changes are due to variations in humidity, which can typically be ignored. By augmenting the present invention with externally measured temperature, wind direction and wind speed, the accuracy of the system can be preserved. An environmental factors component 252 can be included with the present invention to input environmental data such as temperature, wind direction and wind speed. One embodiment of the described invention includes a temperature measurement at the central processor, which allows for the calculation of acoustic speed. In another embodiment, data is acquired from another source, such as a local meteorological station to provide the input to compute sound speed. This computation is performed using widely known and accepted equations.

To correct for wind speed, note that sound will travel with respect to the terrain as a sum of the wind speed and direction vector and the sound speed. Therefore the component of wind along the direction between the receiver and the lightning source can either retard or advance the effective velocity of the thunder. In one embodiment of the invention, three remote receivers are used and the central processor acquires external information on the wind speed and direction from a local measuring station. The three receivers are used to compute a preliminary source location. The angles between the receivers and the estimated source location are used to recompute the estimated ranges, R, using the following formula:

$$R = TOA*V = TOA*(c - V_w \cos(\theta - \Theta))$$

where TOA=measured time interval between the electromagnetic and sonic signals
  V=effective sonic velocity
  c=actual sonic velocity based on temperature
  $V_w$=wind speed
  θ=azimuth direction measured from receiver to source
  Θ=azimuth of wind vector as measure from North These new range estimates are used to determine a new location as previously described. This process can be iterated until the estimated position of the source does not vary more than the expected variance based on the GDOP.

Alternatively, if wind speed and direction information are not available externally, the wind speed and direction can be estimated if a fourth (or more) receiver 240 is included. Again, the measured ranges are used to compute a source location using iterative least squares procedure (i.e. guess a location, then use linearized range equations to derive a correction vector, etc.). Once this procedure has resulted in an estimate, a second, nonlinear programming technique operating on the range equation given above is used to estimate the location (x, y) of the source along with the wind velocity and direction. This procedure minimizes the variance of all four variables jointly. This accuracy of this process improves as the number of receivers is increased. The efficacy of this nonlinear process is also improved by using the residuals (the differences between the range to the estimated point and the measured ranges) to estimate the wind speed and direction.

The process is now described in detail. The equation for the range in terms of Xp and Yp the coordinates of the source point and Xi and Yi the coordinates of receiver "i" is given by (ignoring for the moment the wind):

$$\Delta T_i = \frac{R_i}{c} = \frac{1}{c}((X_P - X_i)^2 + (Y_P - Y_i)^2)^{1/2}$$

where there is one such equation for each detector. If this equation is expanded in terms of the coordinates of the event the following is obtained:

$$\Delta T_m = \Delta T_P + \left(\frac{\partial R}{\partial X_P}\right)\Delta X_P + \left(\frac{\partial R}{\partial Y_P}\right)\Delta Y_P$$

Take ΔTm to be the measured time difference while ΔTp is the time difference that would be measured from an assumed position p and evaluate the derivatives at the assumed position p, and interpret that the $\Delta X_P$ and $\Delta Y_P$ are components of a first order correction to the assumed position in a direction to reduce the difference between the measured ΔTm and the computed ΔTp. By listing these linear equations in rows a matrix equation can be constructed and solve for the $\Delta X_P$ and $\Delta Y_P$ values. The derivative terms are:

$$\left(\frac{\partial R}{\partial X_P}\right) = \frac{X_P}{R}$$

$$\left(\frac{\partial R}{\partial Y_P}\right) = \frac{Y_P}{R}$$

which are easily calculated using the value for an assumed point Xp and Yp. Our total equation in matrix form looks like:

$$\begin{pmatrix} \Delta T_{m1} - \Delta T_P \\ \Delta T_{m2} - \Delta T_P \\ \Delta T_{m3} - \Delta T_P \end{pmatrix} = \begin{pmatrix} \frac{X_P}{R_1} & \frac{Y_P}{R_1} \\ \frac{X_P}{R_2} & \frac{X_P}{R_2} \\ \frac{X_P}{R_3} & \frac{Y_P}{R_3} \end{pmatrix} \begin{pmatrix} \Delta X_P \\ \Delta Y_P \end{pmatrix}$$

In matrix notation this same equations reads:

$$\delta \Delta T = H \cdot \Delta X$$

To solve for the ΔX matrix the generalized inverse of the matrix H is taken. The solution is given by:

$$\Delta X = (H^T H)^{-1} H^T \delta \Delta T$$

Once the correction vector ΔX is solved, it can be added to the presumed values of Xp and Yp to create a new estimate.

Thus the estimate at time step n is transformed into a new estimate a step n+1. After each step, the size of the residuals, the elements of the δΔT vector, are evaluated. When they become sufficiently small the process can be considered complete. The final values of the Xp and Yp coordinates are used as the initial values of the next step which will estimate the event position jointly with wind speed and direction.

Since each measurement of ΔT contains errors due to the wind speed, direction, and other errors (refraction, timing errors, errors in estimating the peak of the sound waveform, and so on) it is desirable to develop a figure of merit for the resulting solution. Specifically relating the errors in the ΔT's to the errors in $X_P$ and $Y_P$ that represent our final and best estimates is desirable. The covariance matrix of the errors in the four ΔT measurements given as follows:

$$COV(\Delta T_i) = E\{\varepsilon_{\Delta Ti}\varepsilon_{\Delta Ti}^T\} = \sum_{\Delta T} = \begin{pmatrix} \sigma_1^2 & \sigma_{12} & \sigma_{13} & \sigma_{14} \\ \sigma_{12} & \sigma_2^2 & \sigma_{23} & \sigma_{24} \\ \sigma_{31} & \sigma_{32} & \sigma_3^2 & \sigma_{34} \\ \sigma_{41} & \sigma_{42} & \sigma_{43} & \sigma_4^2 \end{pmatrix}$$

where the diagonal terms represent the variances of each measurement and the off-diagonal terms represent the covariances between measurements. The off diagonal terms represent the degree of correlation between the measurements. In the case of random errors only (such a digitizing timing jitter and random variations in the sound waveform) these terms are zero. In the case of systematic errors including the effects of wind, they will not be zero. If the error sources are unknown, such as the wind speed and direction, it can be assumed that the covariances are zero. The matrix can be constructed by inserting identical values for the diagonal elements representing ΔT measurement errors derived from field tests or other considerations. The covariance matrix becomes the unit matrix multiplied by a scalar quantity σΔT which represents the level of confidence chosen. Typically the sigma value is selected to represent a level of confidence such that the probability of a randomly chosen value of delta T falling within that distance of the mean is 68.3%. The following steps will result in error figures for the coordinates that will be based on the same confidence limit. The covariance matrix then is a unit matrix of rank four multiplied by a scalar value of error in units of time.

Likewise, there is a covariance matrix of the estimated position values $X_P$ and $Y_P$ given as follows:

$$COV(X) = E\{\varepsilon_X \varepsilon_X^T\} = \sum_X = \begin{pmatrix} \sigma_x^2 & \sigma_{xy} \\ \sigma_{yx} & \sigma_y^2 \end{pmatrix}$$

where again, the diagonal terms are the variances of each coordinate and the off diagonal terms are their covariants already derived transformation from the delta T equation to the delta X's can be used to find the covariance matrix in X as follows:

$$\Sigma_X = (H^T H)^{-1} H^T \Sigma_{\Delta T}$$

Since the covariance matrix is symmetrical and positive definite it represents a quadratic form. If expressed in the following form it gives rise to an ellipse centered on the final estimates of $X_P$ and $Y_P$:

$$f(x) = x^T \Sigma_x x$$

This ellipse has semimajor and semiminor axes given by:

$$a^2 = \frac{1}{2}(\sigma_x^2 + \sigma_y^2) + \sqrt{\frac{1}{4}(\sigma_x^2 - \sigma_y^2)^2 + \sigma_{xy}^2}$$

$$b^2 = \frac{1}{2}(\sigma_x^2 + \sigma_y^2) - \sqrt{\frac{1}{4}(\sigma_x^2 - \sigma_y^2)^2 + \sigma_{xy}^2}$$

So unless the covariances are zero, the ellipse is inclined with respect to the x axis so that the angle between the semimajor axis and the x axis is given by:

$$\tan 2\gamma = \frac{2\sigma_{xy}}{\sigma_x^2 - \sigma_y^2}$$

Note that the value of confidence applied was 68.3%, the probability that the actual value falls within the ellipse is significantly reduced to only 39.4%. Thus many practitioners derive an ellipse based on 2.447 times the one sigma values to get an ellipse encircling a 95% confidence level.

The GDOP is given by:

$$GDOP = \sqrt{TRACE((H^T H)^{-1} H^T)}$$

This represents the magnification factor of the error based on the geometry of the lightning detectors and the computed lightning location. The GDOP is relevant to the present invention only in that should it be possible to select the best subset of available measurements (more than 4 receivers) the processor will select those that gave the best GDOP.

A preliminary solution has been provided without modeling any wind effects. Next, estimates of the wind speed and direction from at least four lightning delta T measurements can be derived. By returning to the basic equation of delta T as a function of wind speed and direction:

$$\Delta T = \frac{R}{(c - V_W \cos(\theta - \vartheta))}$$

Again, if a lightning location is assumed and a set of values for the wind speed and direction, this function can be expanded in a first order Taylor series as follows:

$$\Delta T_M = \Delta T_P + \left(\frac{\partial F}{\partial X_P}\right) dX + \left(\frac{\partial F}{\partial Y_P}\right) dY_P + \left(\frac{\partial F}{\partial V_W}\right) dV_W + \left(\frac{\partial F}{\partial \vartheta}\right) d\vartheta$$

where each derivative is evaluated at the assumed values of position and wind characteristics. If four such measurement equations are written in matrix form the following results:

$$\begin{pmatrix} \delta T_1 \\ \delta T_2 \\ \delta T_3 \\ \delta T_4 \end{pmatrix} = \begin{pmatrix} \alpha_1 & \beta_1 & \gamma_1 & \eta_1 \\ \alpha_2 & \beta_2 & \gamma_2 & \eta_2 \\ \alpha_3 & \beta_3 & \gamma_3 & \eta_3 \\ \alpha_4 & \beta_4 & \gamma_3 & \eta_4 \end{pmatrix} \begin{pmatrix} dX_P \\ dY_P \\ dV_W \\ d\vartheta \end{pmatrix} \text{ or } \delta T = A\Delta X$$

where the A matrix elements are the values of the derivatives evaluated at the assumed values of the position, wind speed and direction. The equations for the derivatives are:

$$\alpha_i = \frac{\partial}{\partial X_P}\left\{\frac{R}{c\left(1-\frac{V_w}{c}\cos(\theta-\vartheta)\right)}\right\} = \frac{(X_i-X_P)}{cR\left(1-\frac{V_w}{c}\cos(\theta-\vartheta)\right)}$$

$$\beta_i = \frac{(Y_i-Y_P)}{cR\left(1-\frac{V_w}{c}\cos(\theta-\vartheta)\right)}$$

$$\gamma_i = \frac{R\cos(\theta-\vartheta)}{c^2\left(1-\frac{V_w}{c}\cos(\theta-\vartheta)\right)^2}$$

$$\eta_i = \frac{R\sin(\theta-\vartheta)}{c^2\left(1-\frac{V_w}{c}\cos(\theta-\vartheta)\right)^2}$$

When the values of the coefficients are evaluated, a simple matrix inversion is computed to find the values of the elements of the ΔX vector. These four values are then added to the original set of assumed values for the four sought parameters to derive a new set. The residuals (elements of δT matrix) are evaluated between each iteration. When the residuals become sufficiently small, the process is complete. To compute the variances proceed as before with:

$$\Sigma_x = A^{-1}\Sigma_{\delta T}$$

and the error ellipse and GDOP are computed as before with the exception of only using the upper left block of four elements of the sigma x matrix.

This process results in optimal least square estimates of the position of the lightning strike and the errors in those estimates.

Conclusion

A system and method of determining locations of lightning strikes has been described. The system includes multiple receivers located around an area of interest, such as a space center or airport. Each receiver monitors both sound and electric fields. The detection of an electric field pulse and a sound wave are used to calculate a range circle around each receiver in which the lighting is detected. A processor is coupled to the receivers to accurately determine the location of the lighting strike. The processor can manipulate the receiver data to compensate for environmental variables such as wind, temperature, and humidity. Further, the system can discriminate between distant and local lightning strikes.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system to determine a location of lighting strikes comprising:
   a processor; and
   a plurality of receivers coupled to the processor, wherein each of the plurality of receivers comprises an electric field sensor, an acoustic sensor, and a controller to provide a receiver output indicating a calculated time differential between an electric field pulse and a sound wave, the processor determines the location of lighting strikes in response to the output from the plurality of receivers.

2. The system of claim 1 wherein each of the plurality of receivers are located up to at least one kilometer apart.

3. The system of claim 1 wherein the processor compensates for wind speed and wind direction while determining the location of lighting strikes.

4. The system of claim 3, wherein the processor compensates for wind speed and wind direction in the absence of wind speed and wind direction measurements.

5. The system of claim 1 wherein the processor compensates for temperature while determining the location of lighting strikes.

6. The system of claim 1 wherein the processor compensates for humidity while determining the location of lighting strikes.

7. The system of claim 1 wherein the plurality of receivers comprise three receivers.

8. A system to determine a location of lighting strikes comprising:
   at least three receivers wherein each receiver comprises an electric field sensor, an acoustic sensor, and a controller to provide a receiver output indicating a calculated time differential between an electric field pulse and a sound wave; and
   a processor coupled to the receivers to determine the location of lighting strikes in response to the output from the receivers.

9. The system of claim 8 wherein the processor compensates for environmental conditions including wind speed and wind direction, temperature and humidity while determining the location of lighting strikes.

10. The system of claim 9, wherein wind speed is corrected for by
    using angles between the receivers and the lighting location to compute estimated ranges R, using the following formula:

$$R = TOA*V = TOA*(c - V_w \cos(\theta - \Theta))$$

where TOA=measured time interval between the electromagnetic and sonic signals

V=effective sonic velocity c=actual sonic velocity based on temperature $V_w$=wind speed θ=azimuth direction measured from receiver to source Θ=azimuth of wind vector.

11. The system of claim 8 wherein each of the receivers are located up to one kilometer apart.

12. A method for determining a location of lighting strikes comprising:
    locating a network of at least three electric field sensors and at least three sonic sensors in an area of interest;
    collecting lightning strike information, including a time of arrival of an electric field pulse and an associated sound wave from a lightning strike;
    processing the lightning strike information recorded by the at least three electric field sensors and the at least three sonic sensors, including measuring a time difference between the arrival of the electric field pulse and the sound wave at each electric field and sonic sensor; and
    determining the location of the lightning strike.

13. The method of claim 12 wherein determining the location of the lightning strike comprises compensating for environmental conditions including wind speed and wind direction, temperature and humidity.

14. The method of claim 12 wherein the at least three electric field sensors are located up to one kilometer apart, and the least three sonic sensors are located up to one kilometer apart.

15. The method of claim 12 wherein determining the location of the lightning strike comprises comparing the arrival of the electric field pulse and the sound wave for each pair of receivers.

16. The method of claim 12 wherein the network comprises at least four electric field sensors and at least four associated sonic sensors.

17. The method of claim 16, wherein wind speed is corrected for by using angles between the receivers and the lighting location to compute estimated ranges R, using the following formula:

$$R = TOA * V = TOA * (c - V_w \cos(\theta - \Theta))$$

where TOA=measured time interval between the electromagnetic and sonic signals

V=effective sonic velocity c=actual sonic velocity based on temperature $V_w$=wind speed θ=azimuth direction measured from receiver to source Θ=azimuth of wind vector.

18. The method of claim 12 wherein the processor compensates for wind speed and wind direction while determining the location of lighting strikes.

19. The method of claim 12, wherein the processor compensates for wind speed and wind direction in the absence of wind speed and wind direction measurements.

20. The method of claim 12 wherein processing the lightning strike information comprises discriminating between lightning strikes based upon distance to filter out lightning strikes outside the area of interest.

* * * * *